United States Patent
Avni et al.

(10) Patent No.: US 7,262,139 B2
(45) Date of Patent: Aug. 28, 2007

(54) METHOD SUITABLE FOR BATCH ION ETCHING OF COPPER

(75) Inventors: Eitan Avni, Karmiel (IL); Elad Irron, Gush Segev (IL); Avi Neta, Gilon (IL)

(73) Assignee: AVX Israel, Ltd., Jerusalem (IL)

( * ) Notice: Subject to any disclaimer, the term of this patent is extended or adjusted under 35 U.S.C. 154(b) by 0 days.

(21) Appl. No.: 11/131,369

(22) Filed: May 18, 2005

(65) Prior Publication Data

US 2005/0272267 A1   Dec. 8, 2005

Related U.S. Application Data

(60) Provisional application No. 60/654,508, filed on Feb. 22, 2005, provisional application No. 60/575,819, filed on Jun. 2, 2004.

(51) Int. Cl.
*H01L 21/302* (2006.01)
(52) U.S. Cl. .............. 438/714; 438/720; 438/725; 134/1.2; 216/63; 216/75
(58) Field of Classification Search ............ 216/63, 216/75, 78; 438/714, 720, 725, 734; 134/1.2
See application file for complete search history.

(56) References Cited

U.S. PATENT DOCUMENTS

| 5,225,969 | A | | 7/1993 | Takay et al. | |
|---|---|---|---|---|---|
| 5,244,536 | A | * | 9/1993 | Tani et al. | 216/48 |
| 5,363,080 | A | | 11/1994 | Breen | |
| 5,422,307 | A | * | 6/1995 | Ishii | 438/384 |
| 5,443,688 | A | * | 8/1995 | Toure et al. | 438/3 |
| 6,488,862 | B1 | | 12/2002 | Ye et al. | |
| 6,498,364 | B1 | | 12/2002 | Downey et al. | |
| 6,538,300 | B1 | | 3/2003 | Goldberger et al. | |
| 6,621,142 | B2 | | 9/2003 | Goldberger et al. | |
| 6,720,604 | B1 | | 4/2004 | Fritzinger et al. | |
| 2002/0084034 | A1 | * | 7/2002 | Kofuji et al. | 156/345.48 |

FOREIGN PATENT DOCUMENTS

| JP | 58-058283 | * | 4/1983 |
|---|---|---|---|
| JP | 59-123246 | * | 7/1984 |
| JP | 60-103668 | * | 6/1985 |
| JP | 01-056886 | * | 3/1989 |

OTHER PUBLICATIONS

Shareef et al; Subatmospheric chemical vapor deposition ozone/TEOS process for SiO2 trench filling; J of Vac. Sci. Technol. Jul./Aug. 1995 pp. 1888-1892.

* cited by examiner

*Primary Examiner*—George A. Goudreau
(74) *Attorney, Agent, or Firm*—Simon Kahn

(57) ABSTRACT

A method for etching metal deposited on a substrate, the method comprising: depositing a metal layer above a substrate; coating at least a portion of the deposited metal layer with a photo-resist; patterning the photo-resist; etching the deposited metal layer with an inert gas plasma at an energy density of less than 0.5 Watt/cm$^2$, the substrate being maintained at a temperature of less than 50° C.; and ashing a resultant crust with an ashing gas, the ashing gas comprising $CF_4$ and $O_2$.

7 Claims, 3 Drawing Sheets

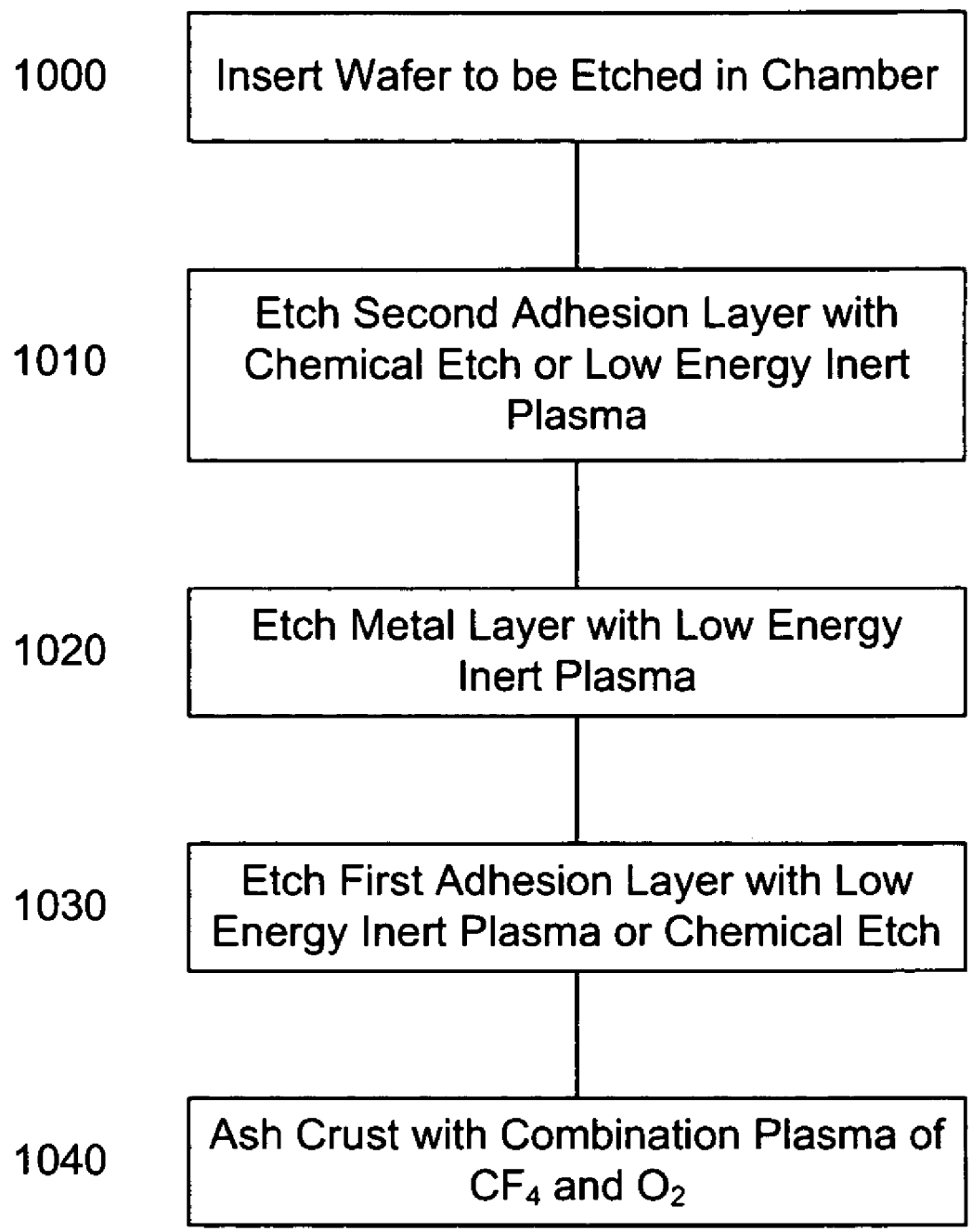

METHOD SUITABLE FOR BATCH ION ETCHING OF COPPER

CROSS-REFERENCE TO RELATED APPLICATIONS

This application claims priority from provisional patent application Ser. No. 60/575,819 filed Jun. 2, 2004 entitled "Integrated Capacitor for RF Applications" and provisional patent application Ser. No. 60/654,508 filed Feb. 22, 2005 entitled "Method Suitable for Batch Ion Etching of Copper" the contents of both of which are incorporated herein by reference, and is related to co-filed patent application entitled "Integrated Capacitor for RF Applications" the contents of which is incorporated herein by reference.

BACKGROUND OF THE INVENTION

The invention relates generally to the field of semiconductor technology and in particular to a method for etching metal with high accuracy.

The increasing need for communications has been a consistent driver for expanding the spectrum utilized for wireless communications. In recent years frequencies in excess of 10 GHz have become commonplace in satellite video and data transmission, while frequencies up to 3 GHz are common in cellular communications. In general, components designed for such high frequencies are also known as radio frequency (RF) components. The generation and detection of RF requires precision passive electronic components, such as capacitors, inductors and resonant filters. Unfortunately, precision passive electronic components are typically expensive and as such prevent the rapid spread of technology based on these frequencies.

Semiconductor manufacturing technology is well developed, and is an excellent technology for reducing the cost of devices and components, while maintaining a high level of precision and repeatability. Many prior art techniques exist for manufacturing capacitors, unfortunately the need for high precision as required for RF applications, and low cost has not been met. In particular a number of barriers to precision control include diffusion of any deposited metal, lack of adhesion of a deposited metal to a dielectric and precision control of the height of a dielectric.

In certain precision RF passive components there is a need to produce metal lines of 6-25 microns is width with an accuracy of plus or minus 0.5 micron. Preferably the metal comprises copper. An accuracy of greater than 10% is difficult to achieve with prior art equipment.

Thus, there is a need for a method for producing a precision RF passive component, allowing accuracy greater than 10% and suitable for use with a metal such as copper.

SUMMARY OF THE INVENTION

Accordingly, it is a principal object of the present invention to overcome the disadvantages of prior art methods of production. This is provided in the present invention by a method comprising a single etching process chamber having a plurality of gas inputs. One of the gas inputs is connected to a source of inert gas such as Argon. A second one of the gas inputs is connected to a source of $CF_4$ and a third one of the gas inputs is connected to a source of $O_2$, each of the gas inputs being individually controlled. A silicon substrate having a metal layer deposited thereon, such as copper or tantalum, is etched via a low energy plasma at a substrate temperature of less than 50° C. This results in a crust on the outer surface of the photoresist. The crust is ashed by replacing the inert gas with a combination of active gasses, preferably a mixture of $CF_4$ and $O_2$. In one embodiment a metal layer is further etched utilizing only $CF_4$.

The invention provides for a method for etching metal deposited on a substrate, the method comprising: depositing a metal layer above a substrate; coating at least a portion of the deposited metal layer with a photo-resist; patterning the photo-resist; etching the deposited metal layer with an inert gas plasma at an energy density of less than 0.5 Watt/cm$^2$, the substrate being maintained at a temperature of less than 50° C.; and ashing a resultant crust with an ashing gas, the ashing gas comprising $CF_4$ and $O_2$.

In one embodiment the etching and the ashing are done in a single chamber. In another embodiment the metal layer comprises one of a conducting metal layer, an adhesion metal layer and a diffusion barrier metal layer. In another embodiment the metal layer comprises a noble metal, preferably one of gold, silver and platinum.

In one embodiment the metal layer comprises copper. In another embodiment the metal layer comprises an adhesion metal layer, the adhesion metal layer being constituted of one of chrome and titanium. In yet another embodiment the metal layer comprises a diffusion barrier metal layer, the diffusion barrier metal layer being constituted of one of tantalum nitride and nickel. In another embodiment the metal layer comprises one of copper, tantalum, platinum, gold and titanium. In yet another embodiment the method further comprises depositing an adhesion layer above the metal layer.

In one embodiment the method further comprises etching the adhesion layer with $CF_4$. Preferably, the etching of the adhesion layer is accomplished at: a gas flow of 100-2500 sccm; a pressure of between 30 mTorr and 3 Torr; RF power density of less than 0.5 Watt/cm$^2$; and DC bias of 50-300 Volts. Further preferably the DC bias is between 75 and 125 volts.

In one embodiment the method further comprises ashing the photoresist.

Independently, the invention provides for a method for etching copper deposited on a substrate, the method comprising: depositing a copper layer above at least one substrate; coating at least a portion of the deposited copper layer with a photo-resist; patterning the photo-resist; inserting the at least one substrate into an etching chamber; etching the deposited copper layer with an inert gas plasma at an energy density of less than 0.5 Watt/cm$^2$, the substrate being maintained at a temperature of less than 50° C.; and ashing a resultant crust with an ashing gas, the ashing gas comprising $CF_4$ and $O_2$.

Independently, the invention provides for a method for etching copper deposited on a plurality of substrates, the method comprising: depositing a copper layer above each of a plurality of substrates; coating at least a portion of the deposited copper layer with a photo-resist; patterning the photo-resist; inserting the plurality of substrates into an etching chamber; etching the deposited copper layer of each of the plurality of substrates as a batch with an inert gas plasma at an energy density of less than 0.5 Watt/cm$^2$, the substrate being maintained at a temperature of less than 50° C.; and ashing a resultant crust with an ashing gas, the ashing gas comprising $CF_4$ and $O_2$.

Independently, the invention provides for an etch process chamber comprising: a first gas inlet; a second gas inlet; a cryogenic pump associated with the first gas inlet; a turbo-pump associated with the second gas inlet; a means for connecting a chiller; an RF energy source; and a chuck for securing a device comprising a substrate and at least one metal layer deposited thereon, the chuck being cooled via the means for connecting a chiller, the RF energy source being operative to create a plasma.

In one embodiment the etch process chamber further comprises a third gas inlet.

Independently, the invention provides for an etch process chamber comprising: a first gas inlet; a second gas inlet; a cryogenic pump associated with the first gas inlet; a turbo-pump associated with the second gas inlet; a means for connecting a chiller; an RF energy source; and a chuck for securing a plurality of devices, each of the devices comprising a substrate and at least one metal layer deposited thereon, the chuck being cooled via the means for connecting a chiller, the RF energy source being operative to create a plasma.

Independently, the invention provides for etch process equipment comprising: an inert gas; a first reactive etchant gas; a cryogenic pump for operation with the inert gas; a turbo-pump for operation with the reactive etchant gas; an etch process chamber receiving the inert gas and the reactive etchant gas, the etch process chamber comprising: a means for connecting a chiller; an RF energy source; and a chuck for securing at least two devices each of the devices comprising a substrate and at least one deposited metal layer, the chuck being cooled via the means for connecting a chiller, the RF energy source being operative to create a plasma.

In one embodiment the etch process equipment further comprises a second reactive etchant gas. In another embodiment the first reactive etchant gas comprises $CF_4$. In another embodiment the second reactive etchant gas comprises $O_2$. In another embodiment the first reactive etchant gas comprises $CF_4$ and the second reactive etchant gas comprises $O_2$.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings:

FIG. 4 illustrates a high level flow chart of the operation of the etch process equipment of FIG. 3.

DETAILED DESCRIPTION OF THE PREFERRED EMBODIMENTS

Figure 1:
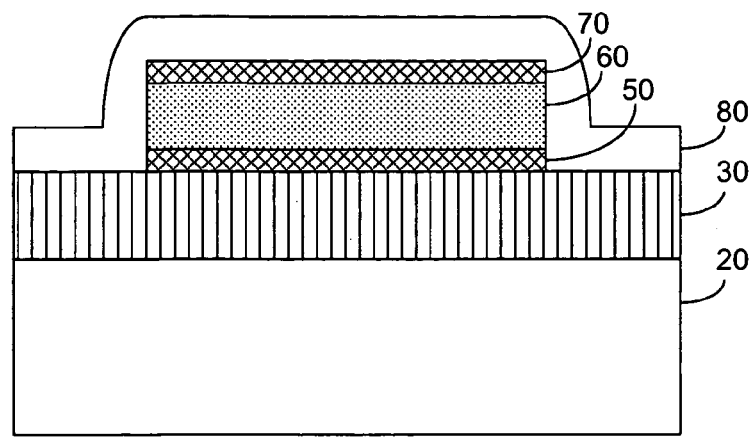
FIG. 1 illustrates a side view of a portion of an RF component produced according to the principle of the invention.

The present embodiments enable a method for producing a precision RF passive component, allowing accuracy greater than 10% and suitable for use with a metal such as copper. Advantageously the method is suitable for use in a single etching process chamber having a plurality of gas inputs. One of the gas inputs is connected to a source of inert gas such as Argon. A second one of the gas inputs is connected to a source of $CF_4$ and a third one of the gas inputs is connected to a source of $O_2$, which can be individually controlled. A silicon substrate having a metal layer deposited thereon, such as copper or tantalum, is etched via a low energy plasma at a substrate temperature of less than 50° C. This results in a crust on the outer surface of the photoresist. The crust is ashed by replacing the inert gas with a combination of active gasses, preferably a mixture of $CF_4$ and $O_2$. In one embodiment a metal layer is further etched utilizing only $CF_4$.

The method is suitable for batch processing and allows for a single etching process chamber etching a plurality of substrates having a plurality of metal layers thereon, in which a first layer is etched via inert gas and a second layer is etched via a chemical etch.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a side view of a portion of an RF component 10 produced according to the principle of the invention. RF component 10 comprises substrate 20; first dielectric layer 30 formed on substrate 20; first adhesion layer 50 formed above first dielectric layer 30; metal layer 60 formed above first adhesion layer 50; second adhesion layer 70 formed above metal layer 60; and second dielectric layer or passivation layer 80. It is to be understood that in certain applications additionally layers, such as those depicted may be formed above second dielectric layer 80.

Metal layer 60 typically comprises a low cost metal such as copper. Proper adhesion between metal layer 60 and both first dielectric layer 30 and second dielectric layer 80 is provided by first adhesion layer 50 and second adhesion layer 70 respectively. In an exemplary embodiment, first and second adhesion layers 50, 70 comprise tantalum. In another embodiment at least one of first and second adhesion layers 50,70 comprise chrome. The invention is being described herein with subsequent layers being deposited directly on layers below. This is not meant to be limiting in any way, and additional layers may be deposited between layers herein described as being deposited on a lower layer without exceeding the scope of the invention.

The invention is being described in relation to a metal layer 60 having a first adhesion layer 50 and second adhesion layer 70. This is not meant to be limiting in any way, and at least one of first and second adhesion layers 50,70 may be replaced by a diffusion barrier layer without exceeding the scope of the invention. In an exemplary embodiment the diffusion barrier layer comprises one of nickel, $Si_3N_4$ and Tantalum Nitride. The invention is further being described herein with a single metal layer however this is not meant to be limiting in any way. In one embodiment a dielectric layer having at least one diffusion barrier layer is deposited above second adhesion layer 70, and a second metal layer is then deposited above the dielectric layer.

Figure 2A:
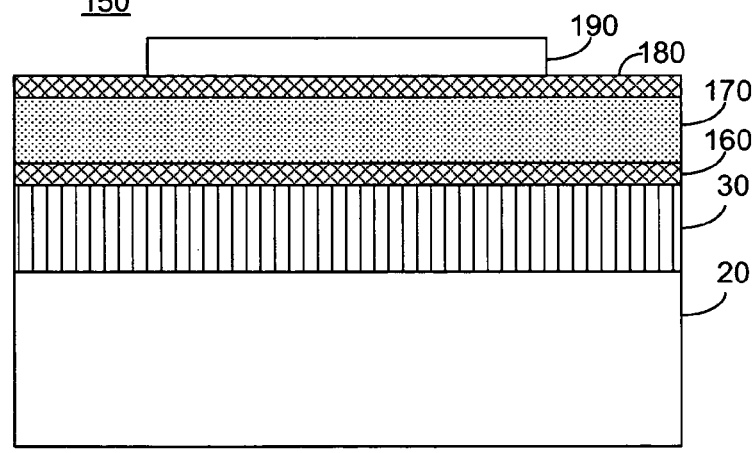
FIG. 2a illustrates a first stage in production of the RF component of FIG. 1 according to the principle of the invention.

FIG. 2a illustrates a first stage in production of RF component 10 of FIG. 1 according to the principle of the invention. The precursor comprises substrate 20; first dielectric layer 30 formed on substrate 20; first adhesion layer 160 formed above first dielectric layer 30; metal layer 170 formed above first adhesion layer 160; second adhesion layer 180 formed above metal layer 170; and photoresist 190 which has been formed to define the production of RF component 10.

Figure 2B:
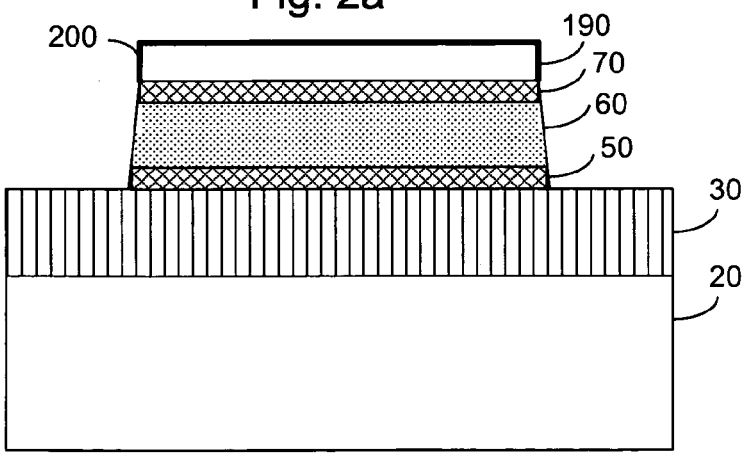
FIG. 2b illustrates a second stage in the production of the RF component of FIG. 1 according to the principle of the invention.

FIG. 2b illustrates a second stage in the production of RF component 10 of FIG. 1 according to the principle of the invention. The precursor comprises substrate 20; first dielectric layer 30 formed on substrate 20; first adhesion layer 50 formed above first dielectric layer 30; metal layer 60 formed above first adhesion layer 50; second adhesion layer 70 formed above metal layer 60; and photoresist 190. Photoresist 190 is herein shown with a crust 200 formed during the removal of portions of first adhesion layer 160, metal layer 170 and second adhesion layers 180 not protected by photoresist 190 as will be described further hereinto below. Removal of the portion of metal layer 170 is accomplished by a low energy inert gas plasma. Removal of the portion of first adhesion layer 160 and second adhesion layer 180 is accomplished by one or more of a low energy inert gas plasma and chemical etching as will be described further. Ashing of crust 200 is further accomplished by chemical etching as will be described further.

Figure 3:
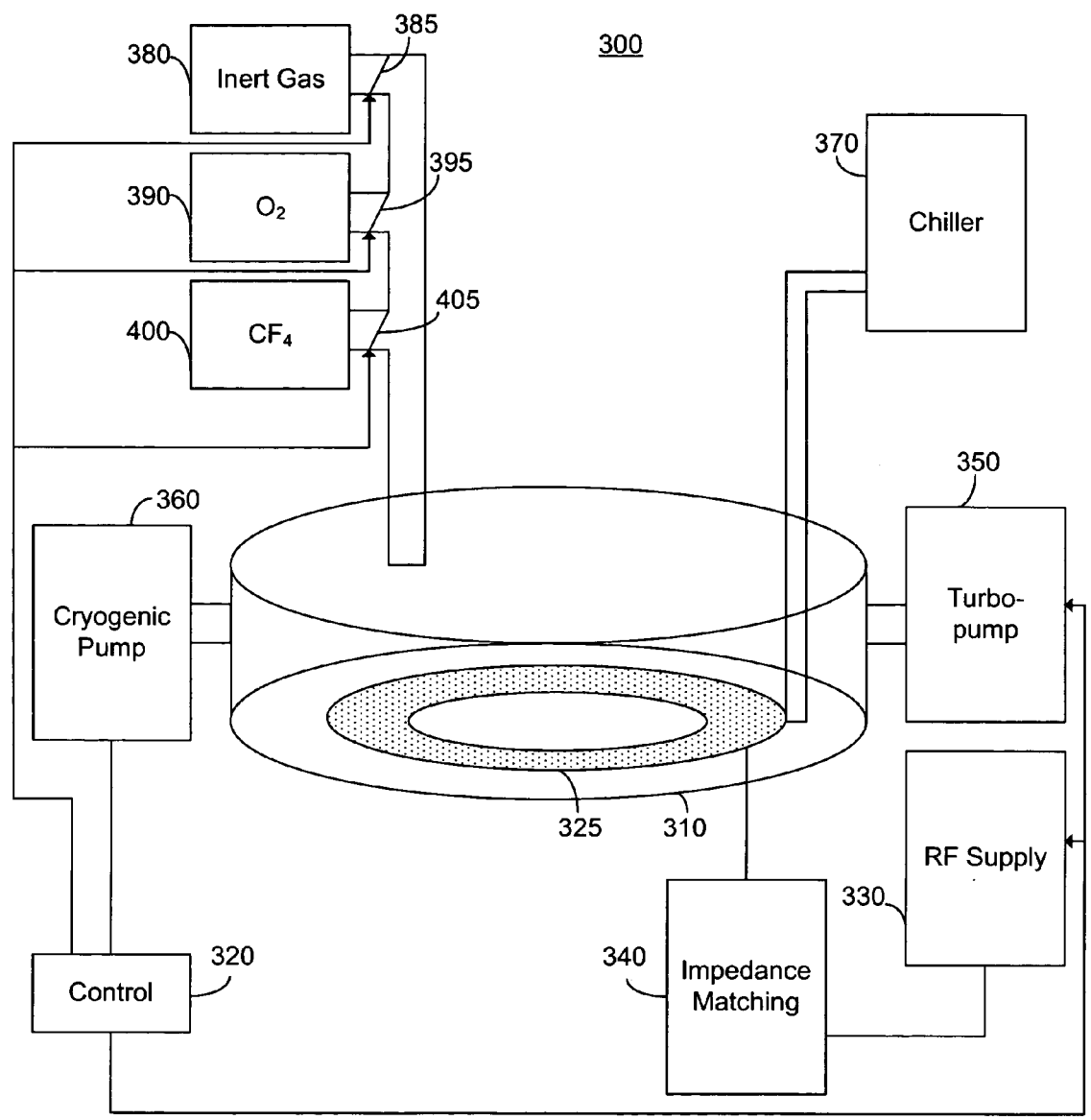
FIG. 3 illustrates a schematic view of etch process equipment according to the principle of the invention.

FIG. 3 illustrates a high level schematic view of etch process equipment 300 according to the principle of the invention comprising: etch process chamber 310 comprising RF supply 330, impedance matching 340 and platen 325; control 320; turbo-pump 350; cryogenic pump 360; chiller 370; inert gas source 380 and associated control valve 385; $O_2$ gas source 390 and associated control valve 395; and $CF_4$ gas source 400 and associated control valve 405. Chiller 370 maintains a controlled temperature for platen 325 thus controlling the temperature of the wafer substrate during etching. DC bias is controlled via RF supply 330. Control 320 is operatively connected to turbo pump 350, cryogenic pump 360, and control valves 385, 395 and 405. In an exemplary embodiment cryogenic pump 360 is associated with a plasma comprising inert gas and turbo pump 350 is associated with a plasma comprising one or more of $O_2$ and $CF_4$. In an exemplary embodiment inert gas source 380 supplies Argon gas.

In operation, control 320 operates valve 405 in combination with turbo-pump 350 to supply $CF_4$ from $CF_4$ gas source 400 thus chemically etching the portion of second adhesion layer 180 of FIG. 2a not protected by photoresist 190. In an exemplary embodiment a gas flow of 100-2500 standard cubic centimeter per minute (sccm), a pressure of between 30 mTorr and 3 Torr, an RF power density of less than 0.5 Watt/cm$^2$ and a DC bias of 40-125 Volts is maintained by control 320.

After evacuation of $CF_4$ upon completion of etching some or all of the portion of second adhesion layer 180 not protected by photoresist 190, control 320 operates valve 385 in cooperation with cryogenic pump 360 to etch the remaining portion of second adhesion layer 180 and the portion of metal layer 170 not protected by photoresist 190 using inert gas from inert gas source 380. Chiller 370 is operative to maintain a low temperature, preferably less than 50° C. In an exemplary embodiment a gas flow of 30-200 standard cubic centimeter per minute (sccm), a pressure of between 3 mTorr and 20 mTorr, an RF power density of less than 0.5 Watt/cm$^2$ and a DC bias of 5-800 Volts is maintained by control 320. Preferably the DC bias is between 400 and 500 volts.

In one embodiment the portion of first adhesion layer 160 not protected by photoresist 190 is etched by inert gas from inert gas source 380. In another embodiment the portion of first adhesion layer 160 not protected by photoresist 190 is at least partially chemically etched by control 320 operating valve 405 in combination with turbo-pump 350 to supply $CF_4$ from $CF_4$ gas source 400. It is to be understood that control 320 is operative to ensure that $CF_4$ does not flow during the flow of inert gas from inert gas source 380.

As described above in relation of FIG. 2b low energy inert plasma etching at least partially creates a crust 200 around the outer perimeter of photoresist 190. Such a crust is not easily removed by standard photoresist etchants. Etch process equipment 300 advantageously allows for a mode operation utilizing a plasma of $O_2$ and $CF_4$ gases thus ashing crust 200. While any temperature, power and gas flow rates may be utilized, in an exemplary embodiment a gas flow of 100-2500 standard cubic centimeter per minute (sccm), a pressure of between 30 mTorr and 3 Torr, an RF power density of less than 0.5 Watt/cm$^2$ and a DC bias of 5-200 Volts is maintained by control 320. Preferably the DC bias is between 40 and 70 volts. In yet another embodiment the plasma of $O_2$ and $CF_4$ further ashes photoresist 190.

FIG. 4 illustrates a high level flow chart of the operation of etch process equipment 300 of FIG. 3. In stage 1000 the wafer to be etched is inserted in process chamber 310 and secured to platen 325. The wafer has areas not to be etched protected by photoresist.

In stage 1010 the portion of second adhesion layer 180 not protected by photoresist is etched by one or more of a chemical etch and a low energy inert ion etch plasma. In an exemplary embodiment the inert ion comprises Argon and the chemical etch comprises $CF_4$. In an exemplary embodiment a gas flow of 100-2500 standard cubic centimeter per minute (sccm), a pressure of between 30 mTorr and 3 Torr, an RF power density of less than 0.5 Watt/cm$^2$ and a DC bias of 50-300 Volts is maintained by control 320. Preferably the DC bias is between 75 and 125 volts. While the inert gas preferably comprises Argon, any inert gas including Xenon may be used without exceeding the scope of the invention. In stage 1020, without removing the wafer from the chamber, the metal layer is etched utilizing a low energy inert ion etch plasma.

In stage 1030 the portion of first adhesion 160 not protected by photoresist is etched by one or more of a chemical etch and a low energy inert ion etch plasma. In an exemplary embodiment the inert ion comprises Argon and the chemical etch comprises $CF_4$.

In stage 1040 crust 200 is ashed from the wafer by a chemical etch comprising a combination plasma of $O_2$ and $CF_4$ gas. It is a unique feature of the invention that this is accomplished without removing the wafer from chamber 310. In particular, while the inert gas etch of stage 1020 is accomplished via cryogenic pump 360 of FIG. 3, ashing stage 1040 is accomplished via turbo-pump 350. In another embodiment photoresist 190 is completely removed by the ashing procedure of stage 1040.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

We claim:

1. A method for etching metal deposited on a substrate to produce a conductor, the method comprising:
   depositing a copper metal layer above a substrate;
   coating at least a portion of said deposited metal layer with a photo-resist;
   patterning said photo-resist;
   etching said deposited copper metal layer with a plasma consisting essentially of inert gas at an energy density of less than 0.5 Watt/cm$^2$ to produce at least one copper metal line, said substrate being maintained at a temperature of less than 50° C.; and
   ashing a resultant crust of said photo-resist coating with an ashing gas, said ashing gas comprising $CF_4$ and $O_2$.

2. A method for etching metal deposited on a substrate, the method comprising:
   depositing a metal layer above a substrate, wherein said metal layer comprises a diffusion barrier metal layer, said diffusion barrier metal layer being constituted of tantalum nitride;
   coating at least a portion of said deposited metal layer with a photo-resist;
   patterning said photo-resist;
   etching said deposited metal layer with a plasma consisting essentially of inert gas at an energy density of less than 0.5 Watt/cm$^2$, said substrate being maintained at a temperature of less than 50° C.; and
   ashing a resultant crust with an ashing gas, said ashing gas comprising $CF_4$ and $O_2$.

3. A method for etching copper deposited on a plurality of substrates to produce a copper metal line, the method comprising:
   depositing a copper layer above each of a plurality of substrates;
   coating at least a portion of said deposited copper layer with a photo-resist;
   patterning said photo-resist;
   inserting said plurality of substrates into an etching chamber;
   etching said deposited copper layer of each of said plurality of substrates as a batch with a plasma consisting essentially of inert gas at an energy density of less than 0.5 Watt/cm$^2$ to produce at least one copper metal line, said substrate being maintained at a temperature of less than 50° C.; and
   ashing a resultant crust of said photo-resist coating with an ashing gas, said ashing gas comprising $CF_4$ and $O_2$.

4. A method according to claim 1, wherein said at least one copper metal line exhibits a width of 6-25 microns.

5. A method according to claim 4, wherein said width of said at least one copper metal line exhibits an accuracy of 0.5 microns.

6. A method according to claim 3, wherein said at least one copper metal line exhibits a width of 6-25 microns.

7. A method according to claim 6, wherein said width of said at least one copper metal line exhibits an accuracy of 0.5 microns.

* * * * *